(12) United States Patent
Duggal et al.

(10) Patent No.: US 6,566,808 B1
(45) Date of Patent: May 20, 2003

(54) LUMINESCENT DISPLAY AND METHOD OF MAKING

(75) Inventors: Anil Raj Duggal, Niskayuna, NY (US); Alok Mani Srivastava, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/469,702

(22) Filed: Dec. 22, 1999

(51) Int. Cl.[7] ................................................ H05B 33/00

(52) U.S. Cl. ..................... 313/512; 313/506; 313/504

(58) Field of Search .................... 313/502, 503, 313/504, 506, 512; 428/640

(56) References Cited

U.S. PATENT DOCUMENTS

| | | | | |
|---|---|---|---|---|
| 3,558,886 A | * | 1/1971 | Carver ......................... | 250/65 |
| 4,186,020 A | * | 1/1980 | Wachtel ....................... | 106/22 |
| 4,539,507 A | | 9/1985 | VanSlyke et al. ........... | 313/504 |
| 4,769,292 A | | 9/1988 | Tang et al. .................. | 428/690 |
| 5,247,190 A | | 9/1993 | Friend et al. ................ | 257/40 |
| 5,294,870 A | | 3/1994 | Tang et al. .................. | 313/504 |
| 5,708,130 A | | 1/1998 | Woo et al. ................... | 528/397 |
| 5,772,741 A | | 6/1998 | Spinelli ..................... | 106/31.25 |
| 5,874,803 A | | 2/1999 | Garbuzov et al. ........... | 313/506 |
| 5,874,804 A | | 2/1999 | Rogers ........................ | 313/512 |
| 5,952,778 A | | 9/1999 | Haskal et al. ............... | 313/504 |
| 5,997,622 A | | 12/1999 | Weber et al. .............. | 106/31.48 |
| 5,998,925 A | * | 12/1999 | Shimizu et al. ............. | 313/503 |
| 6,162,490 A | * | 12/2000 | Graves et al. ................ | 427/71 |
| 6,166,489 A | * | 12/2000 | Thompson et al. ......... | 313/506 |

FOREIGN PATENT DOCUMENTS

EP 0969699 1/2000

OTHER PUBLICATIONS

Florian Pschenitzka et al., *Three–Color Organic Light –Emitting Diodes Patterned by Masked Dye Diffusion*, 74 Appl. Phys. Lett. 1913–1915 (Mar. 29, 1999).

Jayesh Bharathan et al., *Polymer Electroluminescent Devices Processed by Inkjet Printing: I. Polymer Light –Emitting Logo*, 72 Appl. Phys. Lett. 2660–2662 (May 25, 1998).

(List continued on next page.)

*Primary Examiner*—Vip Patel
*Assistant Examiner*—Joseph Williams
(74) *Attorney, Agent, or Firm*—Toan P. Vo; Noreen C. Johnson

(57) ABSTRACT

The invention relates to a luminescent display comprising a first electrode, a second electrode, an organic light emitting layer disposed between the first and second electrodes, and a luminescent material which receives light from the organic light emitting layer and converts the light to a different wavelength, wherein the first and second electrodes together define an overlap region in which the organic light emitting layer is activated to emit light, and the luminescent material is disposed in a portion of the overlap region. The invention also relates to a method comprising the steps of creating an image and printing the image on a light emitting device comprising an organic light emitting layer after the light emitting device has been formed. The image may be created, for example on a personal computer, and printed with an inkjet printer. The image may be printed in phosphors which emit light of one wavelength upon absorbing light of a different wavelength from the organic light emitting layer. Various embodiments of the invention allow customized luminescent displays to be easily fabricated by end users by applying a phosphor pattern to a preformed, encapsulated light emitting device.

14 Claims, 4 Drawing Sheets

OTHER PUBLICATIONS

Hiroyuki Suzuki et al., *Near–Ultraviolet Electroluminescence from Polysilanes*, 331 Thin Solid Films, 64–70, (1998) no month.

Chung–Chih Wu et al.,*Efficient Organic Electroluminescent Devices Using Single–Layer Doped Polymer Thin Films with Bipolar Carrier Transport Abilities*, 44 EE Transactions on Electron Devices, 1269–1281 (Aug. 1997).

Junji Kido, *Organic Displays*, Physics World, 27–30 (Mar. 1999).

G. Gustafsson et al., *Flexible Light–Emitting Diodes Made from Soluble Conducting Polymers*, 357 Nature, 477–479 (Jun. 11, 1992).

Junji Kido et al., *Organic Electroluminescent Devices Based on Molecularly Doped Polymers*, 61 Appl. Phys. Lett. 761–763 (Aug. 17, 1992).

A. W. Grice et al., *High Brightness and Efficiency Blue Light–Emitting Polymer Diodes*, 73 Appl. Phys. Lett. 629–631 (Aug. 3, 1998).

* cited by examiner

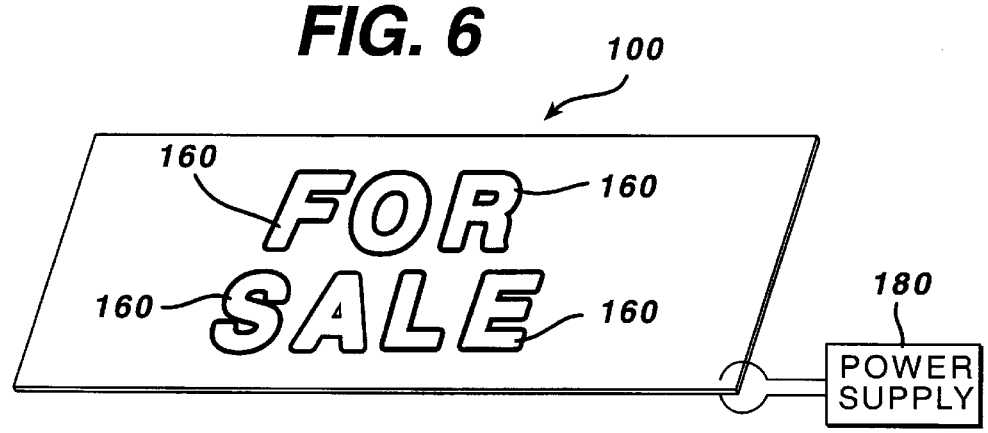
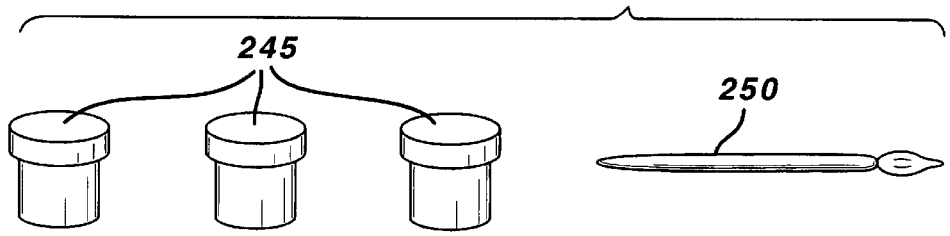
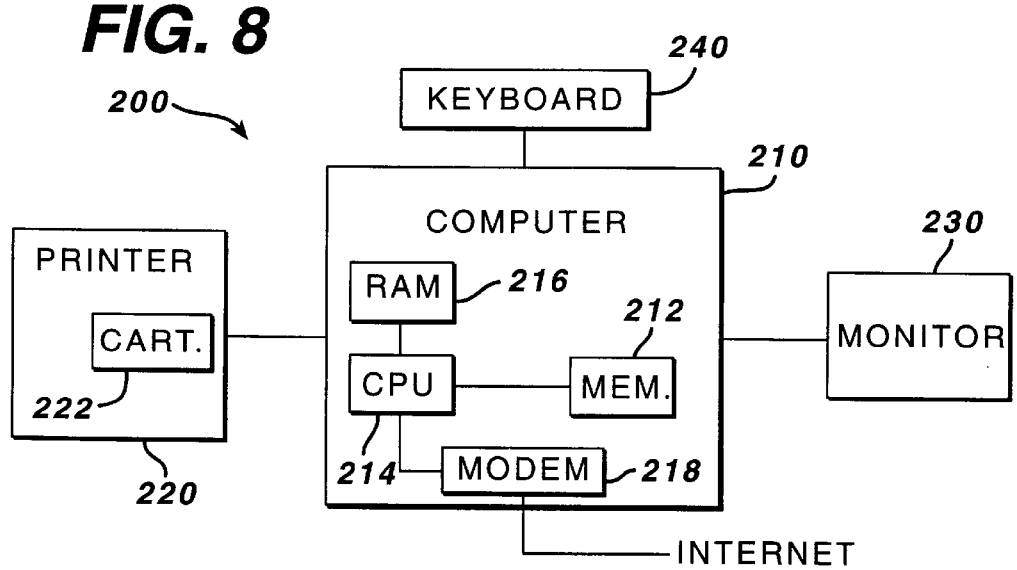

LUMINESCENT DISPLAY AND METHOD OF MAKING

BACKGROUND OF THE INVENTION

1. Field of the Invention

The present invention relates generally to lighting applications, and more particularly to a display device comprising an organic light emitting material.

2. Description of the Related Art

There has been a longstanding desire to make inexpensive signs that can be read in the dark. A conventional approach is to utilize a glass or plastic plate with one or more color filters positioned such that the desired sign is created when placed over a backlight. An example of this is the common "EXIT" sign. This technology, however, is not easily customizable, because the end user is not able to easily design and create such a sign. Most end users do not have the necessary tools or expertise to make the filter plate themselves. Instead, the end user must obtain the services of a filter plate manufacturer to create a customized sign. Most end users do not follow through with such an endeavor.

Many technologies have been developed to allow more customizable signs that can be read in the dark. Most of these are variations on a cathode ray tube (CRT) display. Such displays can be quickly reconfigured electronically to display a new sign. Other technologies with the same capability include liquid crystal displays, thin-film plasma displays, and organic electroluminescent displays. However, these displays require complicated electronics and are too expensive for many simple display sign applications.

Consequently, there is a longstanding need for a simple, inexpensive illuminated sign which can be easily customized by an end user.

BRIEF SUMMARY OF THE INVENTION

The invention relates to a luminescent display comprising a first electrode, a second electrode, an organic light emitting layer disposed between the first and second electrodes, and a luminescent material which receives light from the organic light emitting layer and converts the light to a different wavelength, wherein the first and second electrodes together define an overlap region in which the organic light emitting layer is activated to emit light, and the luminescent material is disposed in a portion of the overlap region.

The invention also relates to a phosphor in solution, a light emitting device comprising a first electrode, a second electrode, and an organic light emitting layer, and means for applying the phosphor onto the light emitting device. The means for applying may comprise a printer cartridge containing at least one phosphor, for example. The printer cartridge may be used to print the luminescent material onto the light emitting device. The means for applying may also comprise a manual implement such as paint brush, a stamp, or a pen. The phosphor solution can be painted, stamped, or written on the light emitting device in any desired pattern and color.

The invention also relates to a method comprising the steps of creating an image and printing the image on a light emitting device comprising an organic light emitting layer after the light emitting device has been formed. The image may be created, for example on a personal computer, and printed with an inkjet printer. The image may be printed in phosphors which emit light of one wavelength upon absorbing light of a different wavelength from the organic light emitting layer.

Various embodiments of the invention allow customized luminescent displays to be easily fabricated by end users by applying a phosphor pattern to a preformed, encapsulated light emitting device. The light emitting device typically comprises an organic light emitting layer which provides illumination over a large surface area. The phosphor pattern can be applied to the light emitting device in a number of ways available to end users, such as with a computer printer or a manual implement. The availability of computer generated images allows end users to create professional quality luminescent displays with minimal investment in equipment.

BRIEF DESCRIPTION OF THE DRAWINGS

Other features and advantages of the invention will be apparent from the following detailed description of preferred embodiments and the accompanying drawings, in which:

FIG. 6 is a perspective view of a luminescent display according to an exemplary embodiment of the invention;

FIG. 7 is a drawing of an apparatus for applying a luminescent material onto a light emitting device according to an exemplary embodiment of the invention;

FIG. 8 is a diagram of an apparatus for applying a luminescent material onto a light emitting device according to another embodiment of the invention;

DETAILED DESCRIPTION OF THE INVENTION

Figure 1:
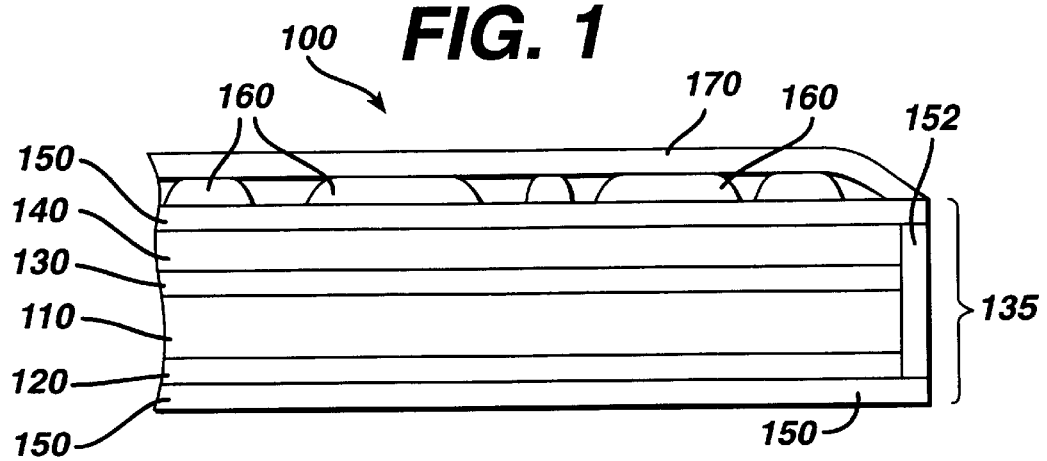
FIG. 1 is a cross sectional view of a luminescent display according to an exemplary embodiment of the invention.

Referring to FIG. 1, a cross section of a luminescent display is shown according to an exemplary embodiment of the invention. FIG. 6 illustrates a perspective view of the luminescent display. The luminescent display 100 includes an organic light emitting layer 110 disposed between two electrodes, e.g., a cathode 120 and an anode 130. The organic light emitting layer 110 emits light upon application of a voltage across the anode and cathode. The anode and cathode inject charge carriers, i.e. holes and electrons, into the organic light emitting layer 110 where they recombine to form excited molecules or excitons which emit light when the molecules or excitons decay. The color of light emitted by the molecules depends on the energy difference between the excited state and the ground state of the molecules or excitons. Typically, the applied voltage is about 3–10 volts but can be up to 30 volts or more, and the external quantum efficiency (photons out/electrons in) is between 0.01% and 5% or more. The organic light emitting layer 110 typically has a thickness of about 50–500 nanometers, and the electrodes 120, 130 each typically have a thickness of about 100–1000 nanometers.

The cathode 120 generally comprises a material having a low work function value such that a relatively small voltage causes emission of electrons from the cathode. The cathode 120 may comprise, for example, calcium or a metal such as gold, indium, manganese, tin, lead, aluminum, silver, magnesium, or a magnesium/silver alloy. Alternatively, the cathode can be made of two layers to enhance electron injection. Examples include a thin inner layer of LiF followed by a thicker outer layer of aluminum or silver, or a thin inner layer of calcium followed by a thicker outer layer of aluminum or silver.

The anode 130 typically comprises a material having a high work function value. The anode 130 is preferably transparent so that light generated in the organic light emitting layer 110 can propagate out of the luminescent display 100. The anode 130 may comprise, for example, indium tin oxide (ITO), tin oxide, nickel, or gold. The electrodes 120, 130 can be formed by conventional vapor deposition techniques, such as evaporation or sputtering, for example.

A variety of organic light emitting layers 110 can be used in conjunction with exemplary embodiments of the invention. According to one embodiment shown in FIG. 1, the organic light emitting layer 110 comprises a single layer. The organic light emitting layer 110 may comprise, for example, a conjugated polymer which is luminescent, a hole-transporting polymer doped with electron transport molecules and a luminescent material, or an inert polymer doped with hole transporting molecules and a luminescent material. The organic light emitting layer 110 may also comprise an amorphous film of luminescent small organic molecules which can be doped with other luminescent molecules.

According to other embodiments of the invention shown in FIGS. 2–5, the organic light emitting layer 110 comprises two or more sublayers which carry out the functions of hole injection, hole transport, electron injection, electron transport, and luminescence. Only the luminescent layer is required for a functioning device. However, the additional sublayers generally increase the efficiency with which holes and electrons recombine to produce light. Thus the organic light emitting layer 110 can comprise 1–4 sublayers including, for example, a hole injection sublayer, a hole transport sublayer, a luminescent sublayer, and an electron injection sublayer. Also, one or more sublayers may comprise a material which achieves two or more functions such as hole injection, hole transport, electron injection, electron transport, and luminescence.

Embodiments in which the organic light emitting layer 110 comprises a single layer, as shown in FIG. 1, will now be described.

According to a first embodiment, the organic light emitting layer 110 comprises a conjugated polymer. The term conjugated polymer refers to a polymer which includes a delocalized π-electron system along the backbone of the polymer. The delocalized π-electron system provides semiconducting properties to the polymer and gives it the ability to support positive and negative charge carriers with high mobilities along the polymer chain. The polymer film has a sufficiently low concentration of extrinsic charge carriers that on applying an electric field between the electrodes, charge carriers are injected into the polymer and radiation is emitted from the polymer. Conjugated polymers are discussed, for example, in R. H. Friend, 4 Journal of Molecular Electronics 37–46 (1988).

One example of a conjugated polymer which emits light upon application of a voltage is PPV (poly(p-phenylenevinylene)). PPV emits light in the spectral range of about 500–690 nanometers and has good resistance to thermal and stress induced cracking. A suitable PPV film typically has a thickness of about 100–1000 nanometers. The PPV film can be formed by spin coating a solution of the precursor to PPV in methanol onto a substrate and heating in a vacuum oven.

Various modifications can be made to the PPV while retaining its luminescent properties. For example, the phenylene ring of the PPV can optionally carry one or more substituents each independently selected from alky alkoxy, halogen, or nitro. Other conjugated polymers derived from PPV may also be used in conjunction with exemplary embodiments of the invention. Examples of such derivatives of PPV include: 1) polymers derived by replacing the phenylene ring with a fused ring system, e.g. replacing the phenylene ring with an anthracene or napthalene ring system. These alternative ring systems may also carry one or more substituents of the type described above with respect to the phenylene ring; 2) polymers derived by replacing the phenylene ring with a heterocyclic ring system such as a furan ring. The furan ring may carry one or more substituents of the type described above in connection with the phenylene ring; 3) polymers derived by increasing the number of vinylene moieties associated with each phenylene or other ring system. The above described derivatives have different energy gaps, which allows flexibility in producing an organic light emitting layer 110 which emits in a desired color range or ranges. Additional information on luminescent conjugated polymers is described in U.S. Pat. No. 5,247,190, which is hereby incorporated by reference.

Other examples of suitable conjugated polymers include polyfluorenes such as 2,7-substituted-9-substituted fluorenes and 9-substituted fluorene oligomers and polymers. The fluorenes, oligomers and polymers are substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy moiety. The fluorene polymers and oligomers may be substituted at the 2- and 7'-positions. The monomer units of the fluorene oligomers and polymers are bound to one another at the 2- and 7'-positions. The 2,7'-aryl-9-substituted fluorene oligomers and polymers may be further reacted with one another to form higher molecular eight polymers by causing the optional moieties on the terminal 2,7'-aryl moieties, which are capable of crosslinking or chain extension, to undergo chain extension or crosslinking.

The 2,7-aryl-9-substituted fluorenes and 9-substituted fluorene oligomers and polymers can be prepared by contacting one or more 2,7-dihalo-9-substituted fluorenes with a haloaromatic compound or haloaromatic compounds, being further substituted with a reactive group capable of crosslinking or chain extension or a trialkylsiloxy moiety, in the presence of a catalytic amount of a divalent nickel salt, at least a stoichiometric amount of zinc powder and a trihydrocarbylphosphine in a polar solvent, under conditions such that a 2,7-aryl-9-substituted fluorene or a 9-substituted fluorene oligomer or polymer is prepared. The 9-substituted fluorene oligomers and polymers terminated at the terminal 2- and 7'-positions with hydrogen or a halogen are prepared by the process described above in the absence of a haloaromatic compound.

The fluorenes and fluorene oligomers or polymers demonstrate strong photoluminescence in the solid state. When such materials are exposed to a light of a wavelength of about 300 to about 700 nanometers, the materials emit light of wavelengths in the region of about 400 to about 800 nanometers. More preferably, such materials absorb light of wavelengths of from about 350 to about 400 nanometers and emit light of wavelengths in the region of about 400 to about 650 nanometers. The fluorenes and fluorene oligomers or polymers of the invention are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on polyfluorenes is described in U.S. Pat. No. 5,708,130, which is hereby incorporated by reference.

According to a second embodiment of a single layer device as shown in FIG. 1, the organic light emitting layer 110 comprises a molecularly doped polymer. A molecularly doped polymer typically comprises a binary solid solution of charge transporting molecules which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methyl methacrylate) (PMMA) molecularly doped with the hole transporting molecule N,N'-diphenyl-N,N'-bis(3-methylsphenyl)-1,1'-biphenyl-4,4'-diamine (TPD) and the luminescent material tris(8-quinolinolato)-aluminum (III) (Alq). TDP has a high hole drift mobility of $10^{-3}$ cm$^2$/volt-sec, while Alq is a luminescent metal complex having electron transporting properties in addition to its luminescent properties.

The doping concentration is typically about 50%, while the molar ratio of TDP to Alq may vary from about 0.4 to 1.0, for example. A film of the doped PMMA can be prepared by mixing a dichloroethane solution containing suitable amounts of TPD, Alq, and PMMA, and dip coating the solution onto the desired substrate, e.g. an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers", 61 Appl. Phys. Lett. 761–763 (1992), which is hereby incorporated by reference.

Figure 2:
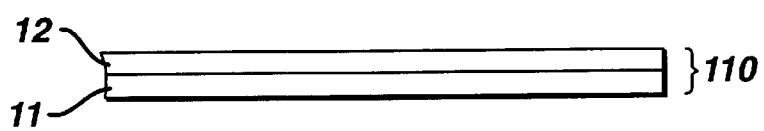
FIGS. 2–5 are cross sectional views of organic light emitting layers according to other embodiments of the invention.

According to another embodiment of the invention shown in FIG. 2, the organic light emitting layer 110 comprises two sublayers. The first sublayer 11 provides hole transport, electron transport, and luminescent properties and is positioned adjacent the cathode 120. The second sublayer 12 serves as a hole injection sublayer and is positioned adjacent the anode 130. The first sublayer 11 comprises a hole-transporting polymer doped with electron transporting molecules and a luminescent material, e.g. a dye or polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprise the organic dyes coumarin 460 (blue), coumarin 6 (green), or nile red. The above materials are available commercially, for example from Aldrich Chemical Inc., Lancaster Synthesis Inc., TCI America, and Lambda Physik Inc. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2–1.0 weight percent organic dye.

The second sublayer 12 serves as a hole injection sublayer and may comprise poly(3,4)ethylenedioxythiophene/polystyrenesulphonate (PEDTIPSS), for example, available from Bayer Corporation, which can be applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities", 44 IEEE Trans. on Elec. Devices 1269–1281 (1997), which is hereby incorporated by reference.

EXAMPLE 1

A blue organic light emitting device was constructed as follows. Indium tin oxide (ITO) coated glass (15 ohm-square) was purchased from Applied Films Corporation and portions of it were etched away using the vapors of aqua regia. This substrate was then mechanically cleaned with a detergent, soaked in a methanol solution followed by a boiling isopropyl alcohol solution, and finally placed in an ozone cleaner for 5 minutes. An approximately 5 nanometer (nm) layer of poly(3,4)ethylenedioxythiophene/polystyrenesulphonate (PEDTIPSS) from Bayer Corporation was then spin coated onto the ITO. Approximately 100 nm of a polymer blend consisting of poly(9-vinyl carbazole) (PVK) from Aldrich Co., 2-(4-biphenylyl)-5-(4-tert-butylphenyl)-1,3,4-oxadiazole (PBD) from Aldrich Co., and 7-Diethylamino-4-methylcoumarin (Coumarin 460) from Exciton Co. with weight percent ratios of 100:40:1 was then spin coated onto the PEDT layer using dichloroethane as the solvent. Next, a cathode consisting of an approximately 0.8 nm layer of lithium fluoride followed by about 100 nm of aluminum was evaporated onto the device through a shadow-mask to define a cathode pattern. The device was then transferred to a glove box and a glass slide was attached to the cathode side of the device with epoxy in order to provide encapsulation. The resulting device emitted blue light upon application of a voltage.

Figure 3:
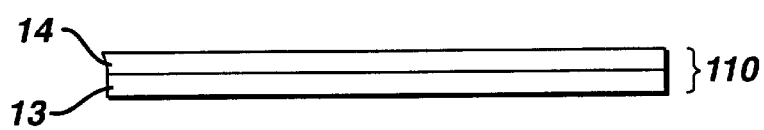

According to another embodiment of the invention shown in FIG. 3, the organic light emitting layer 110 includes a first sublayer 13 comprising a luminescent sublayer and a second sublayer 14 comprising a hole transporting sublayer. The hole transporting sublayer 14 may comprise an aromatic amine that is readily and reversibly oxidizable. For example, hole transporting compounds may include amines that are solid at room temperature and in which at least one nitrogen atom is tri-substituted with substituents, at least one of which is aryl. Aryl substituents in hole transporting compounds include aryl as well as unsubstituted aryl, such as phenyl, and methylphenyl. Examples of useful substituents include alkyls of 1 to 5 carbon atoms, halo, such as chloro and fluoro, and alkoxy having 1 to 5 carbon atoms, such as methoxy, ethoxy, and propoxy. Specific examples include 1,1-bis(4-di-p-tolylaminophenyl)cyclohexane; N,N,N-tri(p-tolyl)amine; 1,1-bis(4-di-p-tolylaminophenyl)-4-phenylcyclohexane; and bis(4-dimethylamino-2-methylphenyl)phenylmethane.

Examples of suitable luminescent materials for the luminescent sublayer 13 include—4,4'-Bis(5,7-di-t-pentyl-2-benzoxazolyl)-stilbene; 2,5-bis(5,7-di-t-pentyl-2-benzoxazolyl)-1,2,4-thiadiazole; and metal complexes of 8-hydroxyquinoline, where the metal is Zn, Al, Mg, or Li. The luminescent sublayer 13 and the hole transporting sublayer 14 can be formed by conventional vacuum deposition techniques. Additional information on such devices is described in U.S. Pat. No. 4,539,507 which is hereby incorporated by reference.

Figure 4:
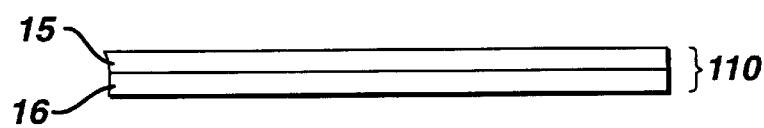

According to another embodiment of the invention shown in FIG. 4, the organic light emitting layer 110 comprises a first sublayer 15 which includes luminescent and hole transport properties, and a second sublayer 16 which includes electron injection properties. The first sublayer 15 comprises a polysilane, and the second sublayer comprises an oxadiazole compound. This structure produces ultraviolet (UV) light.

Polysilanes are linear silicon (Si)-backbone polymers substituted with a variety of alkyl and/or aryl side groups. In contrast to π-conjugated polymers, polysilanes are quasi one-dimensional materials with delocalized σ-conjugated electrons along the polymer backbone chain. Due to their one-dimensional direct-gap nature, polysilanes exhibit a sharp photoluminescence with a high quantum efficiency in the ultraviolet region. Examples of suitable polysilanes include poly(di-n-butylsilane) (PDBS), poly(di-n-pentylsilane) (PDPS), poly(di-n-hexylsilane) (PDHS), poly(methyl-phenylsilane) (PMPS), and poly[-bis(p-butylphenyl)silane] (PBPS). The polysilane sublayer 15 can be applied by spin coating from a toluene solution, for example. The electron injection sublayer 16 may comprise 2,5-bis(4-biphenyl)-1,3,4-oxadiazole (BBD), for example. Additional information on UV-emitting polysilane organic light emitting layers is described in Hiroyuki Suzuki et al, "Near-ultraviolet Electroluminescence from Polysilanes", 331 Thin Solid Films 64–70 (1998), which is hereby incorporated by reference.

Figure 5:
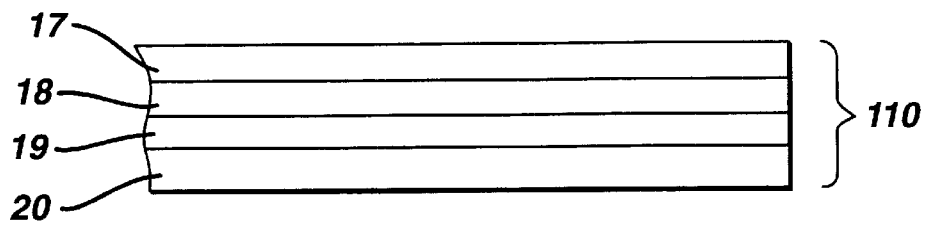

According to another embodiment of the invention shown in FIG. 5, the organic light emitting layer 110 comprises a hole injecting sublayer 17, a hole transporting sublayer 18, a luminescent sublayer 19, and an electron injecting sublayer 20. The hole injecting sublayer 17 and hole transporting sublayer 18 efficiently provide holes to the recombination area. The electrode injecting sublayer 20 efficiently provides electrons to the recombination area.

The hole injecting sublayer 17 may comprise a porphyrinic compound, such as a metal free phthalocyanine or a metal containing phthalocyanine, for example. The hole transporting sublayer 18 may comprise a hole transporting aromatic tertiary amine, where the latter is a compound containing at least one trivalent nitrogen atom that is bonded only to carbon atoms, at least one of which is a member of an aromatic ring. The luminescent sublayer 19 may comprise, for example, a mixed ligand aluminum chelate emitting in the blue wavelengths, such as bis(R-8-quinolinolato)(phenolato)aluminum(III) chelate where R is a ring substituent of the 8-quinolinolato ring nucleus chosen to block the attachment of more than two 8-quinolinolato ligands to the aluminum atom. The electron injection sublayer 20 may comprise a metal oxinoid charge accepting compound such as a tris-chelate of aluminum. Additional information on such four-layer materials and devices are described in U.S. Pat. No. 5,294,870, which is hereby incorporated by reference.

The above examples of organic light emitting layers 110 can be used to design a light emitting device which emits in one or more desired colors. For example, the light emitting device 135 can emit one or more of ultraviolet, blue, green, and red light. The different color regions can be formed by applying two or more organic light emitting layers 110 having different compositions to different regions of the same electrode. The term "light emitting device" generally refers to the combination of the organic light emitting layer 110, the cathode 120, and the anode 130. As shown in FIG. 1, the light emitting device 135 may also include a substrate 140. The substrate 140 provides a base upon which the anode 130, the organic light emitting layer 110, and the cathode 120 can be deposited during formation. The substrate may comprise, for example, glass or a transparent polymer such as MYLAR. The light emitting device 135 and the luminescent material 160 together form the luminescent display 100.

The light emitting device 135 can be encapsulated within an encapsulating layer 150. The encapsulating layer 150 preferably provides water and oxygen barrier properties to reduce or prevent oxidation and hydrolytic degradation of the organic light emitting layer 110 and the electrodes 120, 130. The encapsulating layer 150 may comprise an inorganic material such as glass or quartz which may be adhered to the cathode 120 with epoxy. In the case of a glass encapsulating layer adhered to the cathode 120, the substrate 146 is typically also glass or quartz and can serve as an encapsulating layer, so that the portion of the encapsulating layer 150 shown in FIG. 1 adjacent to the substrate 140 can be omitted. A sealing member 152 can be provided along the perimeter of the device to seal the encapsulation layer 150 adjacent the cathode 120 to the ecapsulation layer 150 adjacent the anode 130. The sealing member 152 may comprise a metal such as tin, indium, titanium, gold, or a combination thereof, for example.

According to another embodiment, the encapsulating layer 150, or a portion thereof, may comprise a polymer such as MYLAR coated with a dielectric material such as silicon monoxide, silicon dioxide, silicon nitride, germanium oxide, or zirconium oxide, for example. A layer of a hydrophobic polymer such as a polysiloxane, TEFLON, or a branched polyolefin, e.g. polyethylene or polypropylene, can be applied to the dielectric material, if desired. According to this embodiment, the encapsulating layer 150 can also serve as the substrate 140, so that a separate substrate 140 can be omitted. Additional encapsulation methods and materials are described in U.S. Pat. Nos. 5,874,804 and 5,952,778, which are hereby incorporated by reference.

As shown in FIG. 1, a luminescent material 160 is applied to a surface of the light emitting device 135. The luminescent material 160 absorbs energy in one portion of the electromagnetic spectrum and emits energy in another portion of the electromagnetic spectrum, as is well known in the art. Typically, the luminescent material 160 comprises an inorganic phosphor. Many inorganic phosphors provide the advantage that they are generally not sensitive to oxygen or moisture. Accordingly, they can be applied to the outside of the encapsulated light emitting device 135 without significant degradation over time. However, other types of luminescent materials, such as organic fluorescent materials can be used.

An example of a suitable red emitting inorganic phosphor is $SrB_4O_7:Sm^{2+}$, where the $Sm^{2+}$ following the colon represents an activator. This phosphor absorbs most visible wavelengths shorter than 600 nm and emits light as a deep red line with a wavelength greater than 650 nm. $SrB_4O_7Sm^{2+}$ can be prepared mixing $SrCO_3$, $H_3BO_3$ taken 5% in excess, and $Sm_2O_3$, and heating the mixture at 900°

C. in a reducing atmosphere, e.g. 5% hydrogen, for 5 hours. Other suitable red emitting phosphors include $Sm^{2+}$ activated $SrB_6O_{10}$, $BaMgF_4$, $LiBaF_3$, and $BaFCl$.

An example of a suitable yellow emitting inorganic phosphor is $Y_3Al_5O_{12}:Ce^{3+}$. This phosphor absorbs most wavelengths below 500 nm and has a maximum emission at about 570–580 nm. $Y_3Al_5O_{12}:Ce$ can be prepared by blending $Y_2O_3$, $Al_2O_3$, $CeO_2$ with 3 mole percent $AlF_3$, which acts as a flux. The blend is then heated a slightly reducing atmosphere at 1500° C. for 6–8 hours.

An example of a suitable green emitting inorganic phosphor is $SrGa_2S_4:Eu^{2+}$ This phosphor absorbs below 500 nm and has a maximum emission at 535 nanometers. $SrGa_2S_4:Eu^{2+}$ can be prepared, for example, by blending $Ga_2O_3$, $SrCO_3$, and $Eu_2O_3$ and heating at 900° C. for four hours under a $H_2S$ stream, then grinding and retreating at 1000° C. under the same conditions.

An example of a suitable blue emitting inorganic phosphor is $BaMg_2Al_{16}O_{27}:Eu^{2+}$. $BaMg_2Al_{16}O_{27}:Eu^{2+}$ absorbs most wavelengths below 430 nm and has a maximum emission at 450 nm. $BaMg_2Al_{16}O_{27}:Eu^{2+}$ can be prepared by firing a blend of $BaCO_3$, $MgO$, $Al_2O_3$ and $Eu_2O_3$ at 1400° C. for 8 hours in a reducing atmosphere.

Examples of organic fluorescent materials which can be used as the luminescent material 160 include 7-diethylamino-4-methylcoumarin (coumarin 460 from Exciton Inc.) which absorbs below 420 nm and emits blue light; 3-(2'-Benzothiazolyl)-7-diethylaminocoumarin (coumarin 540 from Exciton Inc.) which absorbs below 500 nm and emits green light; 4-Dicyanmethylene-2-methyl-6-(p-dimethylaminostyryl)-4H-pyran (DCM from Exciton Inc.) which absorbs below 550 nm and emits red; Fluorol 7GA from Exciton Inc., which absorbs below 500 nm and emits yellow; 3,3'-Diethyloxacarboxyanine Iodide (DOCI from Exciton Inc.) which absorbs below 500 nm and emits green; and Nile Red—(Aldrich Co.) which absorbs below 600 nm and emits red.

The luminescent material 160 may absorb all or only a part of the light emitted by the organic light emitting layer 110. For example, the luminescent material 160 may absorb all the blue light emitted by the organic light emitting layer 110 and emit red light. Alternatively, the luminescent material 160 may absorb only a part of the light emitted by the organic light emitting layer 110 and emit yellow light, for example. In this case, the blue light not absorbed and the yellow light emitted by the phosphor combine to produce another color of light, e.g. white light.

The luminescent material 160 can be applied to the light emitting device 135 in a variety of ways. For example, according to one embodiment, the luminescent material 160 is combined with a carrier medium and is applied to the light emitting device 135 with a conventional printer such as an inkjet printer. In the case that the luminescent material 160 comprises an inorganic phosphor, the inorganic phosphor is typically insoluble in the carrier medium, but is dispersed or suspended in the form of small particles and stabilized against flocculation and settling by a dispersing agent. An example of a suitable suspension comprises about 15 volume percent of phosphor powder (e.g. cerium activated yttrium aluminum garnet) in a liquid medium. The phosphor powder particle size is typically about. 10 microns. The solvent making up most of the liquid medium comprises 1-butanol, for example. Added to this is 0.5 weight percent ethyl cellulose as a binder and 5.0 weight percent of Menhaden fish oil as a dispersant. The material can be ultrasonicated for 15 minutes to uniformly disperse the powder and to break down soft agglomerates.

In the case that the luminescent material 160 comprises an organic dye, the organic dye typically can be dissolved in the carrier medium. The carrier medium may comprise water, for example, and if desired a water soluble co-solvent such as an alcohol, ketone, or ester. A surfactant may also be added to adjust the surface tension of the solution, as is known in the art.

FIG. 8 illustrates an apparatus 200 which is useful for applying the luminescent material 160 to the light emitting device 135 according to an exemplary embodiment of the invention. The apparatus 200 comprises a computer 210, a printer 220, a monitor 230, and a keyboard 240. The computer 210 comprises a memory 212, a central processing unit 214, random access memory 216, and a modem 218, among other components. The memory 212 stores information such as digital images. The central processing unit 214 processes instructions as is well known in the art. The modem 218 provides an interface with a computer network such as the internet, for example, and may receive digital images from the internet. The printer 220 receives data, such as image data, from the computer 210, and prints images in accordance with the data. The printer 220 may include a printer cartridge 222 which delivers at least one phosphor solution to a substrate such as the light emitting device 135 on command. The printer cartridge 222 may include, for example, three reservoirs of phosphor solutions, red, green, and blue, which are printed onto the substrate to create a color image.

The light emitting device 135 can be designed to have standardized paper dimensions, such as 8.5×11 inches, A4 dimensions, etc., as well as suitable flexibility and thickness, so that it will fit into standard printers such as inkjet printers. Consequently, multicolor computer images can be designed with commercially available software and printed on the light emitting device 135. In addition, multiple layers of the luminescent material 160 can be applied with a printer to the light emitting device 135. For example, a green emitting phosphor can be applied over the entire light emitting device 135, and an additional phosphor or phosphors can be applied in a pattern on a portion of the green emitting phosphor.

Figure 10:
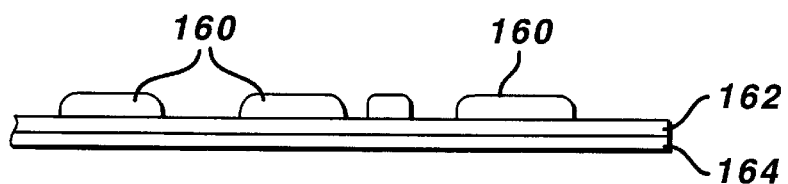
FIG. 10 is a cross section of a device for applying a luminescent material onto a light emitting device according to another embodiment of the invention.

In the case that the light emitting device 135 does not fit into a standard printer or is not sufficiently flexible, the image can be printed onto an intermediate substrate. For example, a phosphor pattern can be printed onto an 8.5×11 inch sheet of transparent material having a transparent adhesive backing. The printed intermediate substrate having the phosphor pattern thereon can then be adhered to the light emitting device 135 by means of the adhesive backing. In this way, light emitting devices of various shapes can be formed and later customized by an end user. FIG. 10 shows a cross section of such a substrate 162 having an adhesive backing 164 and a luminescent material 160.. The image can also be printed, of course, with any large area inject printer, rather than with a conventional ink jet printer designed to print on conventional paper sizes.

According to other embodiments of the invention, the luminescent material 160 is applied to the light emitting device 135 with a suitable carrier medium by a manual implement. The luminescent material 160 can be mixed with a carrier medium and packaged by color. A suitable carrier medium for an inorganic phosphor may comprise, for example, 1-butanol with 0.5 weight percent ethyl cellulose as a binder and 5.0 weight percent of Menhaden fish oil as a dispersant, as described above.

FIG. 7 illustrates three containers 245 containing solutions of three different phosphors, e.g. red, green and blue. FIG. 7 also shows a manual implement 250. The manual implement 250 may be, for example, a paint brush, a stamp, or a pen. The phosphor solution can then be painted, stamped, or written on a light emitting device 135 in any desired pattern and color.

According to another embodiment of the invention, screen printing is used to apply the phosphor solution onto the light emitting device or intermediate substrate. The screen or screens containing the desired pattern are prepared by conventional methods, and the phosphor solution is applied to the light emitting device 135 through the screens to transfer the screen pattern to the light emitting device.

Figure 9:
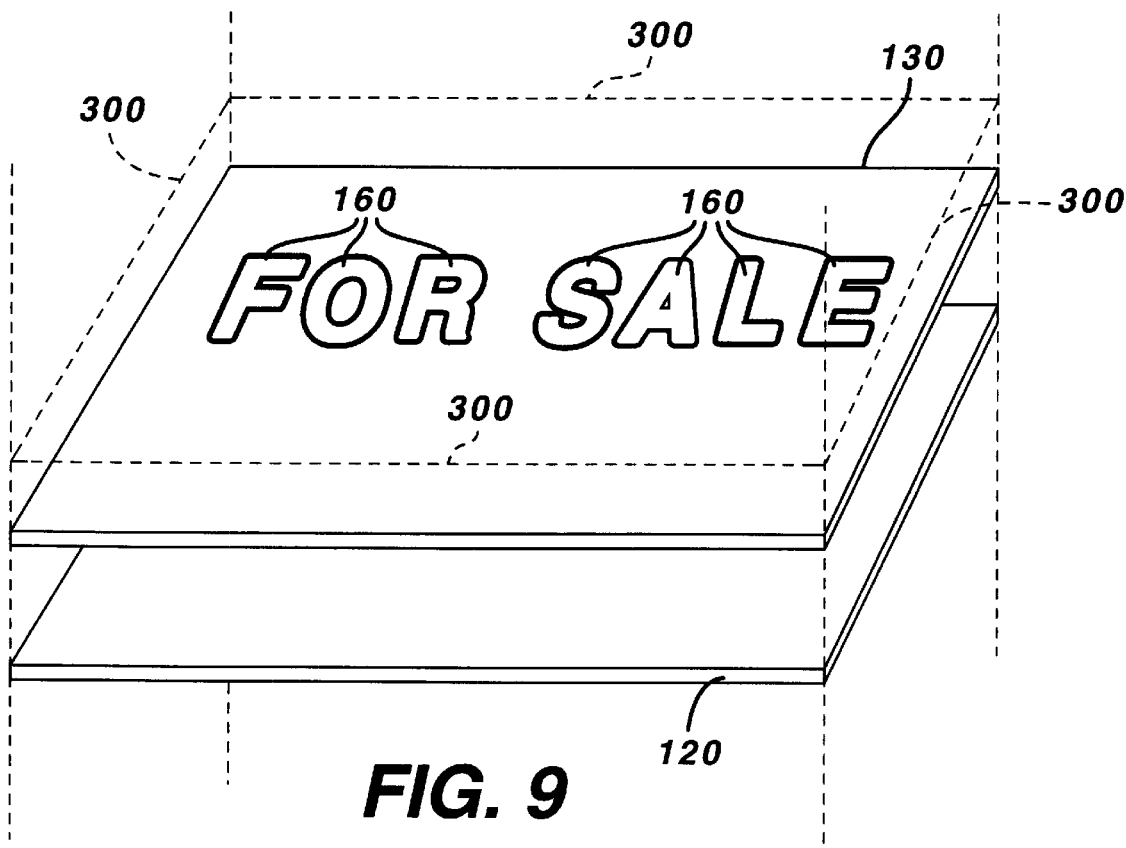
FIG. 9 is a drawing which depicts illuminated regions of a luminescent display according an exemplary embodiment of the invention.

After the phosphor solution has been applied to the light emitting device 135, the phosphor solution dries leaving a luminescent layer 160, as shown in FIG. 1. The luminescent layer 160 forms a pattern on the light emitting device 135. Typically, the luminescent layer 160 does not cover the entire light emitting area of the light emitting device 135. The light emitting area will generally be defined by the overlap region of the two electrodes 120, 130. As shown in FIG. 9, the overlap region 300 is defined as the region in which the electrodes 120, 130 overlap. The electrodes typically have perimeters of substantially the same shape. Typically, the overlap region 300 will be continuous in the sense that it is not made up of discrete, separate regions, but rather a single region. In the overlap region 300, an electric field will be generated to cause the organic light emitting layer 110 to emit light. As shown in FIG. 9, the luminescent material 160, e.g. phosphors, typically occupy a portion, but not all, of the overlap region 300.

The luminescent material 160 may take the form of numbers, letters, ornamental designs, or any other desired form. It can include multiple colors. The power supply 180 shown in FIG. 6 can include a controller which applies a voltage to the luminescent display 100 according to a preset schedule, e.g. blinking once a second.

Figure 11:
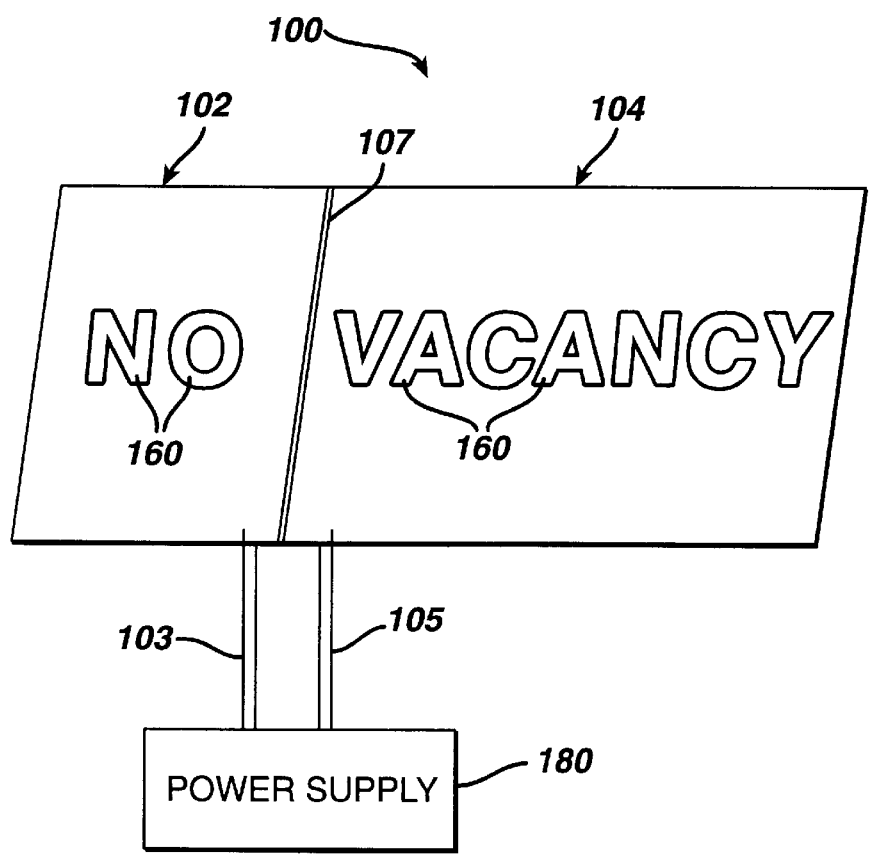
FIG. 11 is a drawing of an exemplary luminescent display which includes multiple electrodes.

According to another embodiment of the invention shown in FIG. 11, the luminescent display 100 includes at least two sets of independently operable electrodes. In FIG. 11, a first set of electrodes controls a first portion 102 of the luminescent display 100, and a second set of electrodes controls a second portion 104. The electrodes are connected to the power supply 180 via lead wires 103, 105. The power supply 180 may include a controller to independently activate the first and second sets of electrodes. For example, as shown in FIG. 11, the "NO" portion 102 can be turned on or off independently of the "VACANCY" portion. If desired, the electrodes can be operated independently according to a preset schedule. In the case of multiple sets of electrodes, each set of electrodes can be electrically insulated from other sets by an electrically insulative material 107.

Referring again to FIG. 1, for abrasion resistance, an abrasion resistant layer 170 can be applied over the luminescent material 160. The abrasion resistant layer 170 may comprise a transparent, abrasion resistant material such as MYLAR or other transparent polymer, for example. The abrasion resistant layer 170 may include an adhesive backing which is used to adhere the abrasion resistant layer 170 to the light emitting device 135 and luminescent material 160. If the luminescent material 160 comprises an inorganic phosphor, the abrasion resistant layer 170 may not need to provide oxygen or moisture barrier properties, as many inorganic phosphors are relatively stable.

Other embodiments of the invention will be apparent to those skilled in the art from a consideration of the embodiments disclosed herein. It is intended that the specification and examples be considered as exemplary only, with the scope and spirit of the invention being defined by the following claims.

What is claimed is:

1. An apparatus comprising:
   only one pair of electrodes consisting of a first electrode and a second electrode;
   an organic light emitting layer disposed between the first and second electrodes, wherein the first and second electrodes together define an overlap region in which the organic light emitting layer is activated to emit light when a voltage is applied across said one pair of electrodes; and
   a luminescent material which receives light from the organic light emitting layer and converts the light to a different wavelength, wherein the luminescent material is disposed in a portion of the overlap region and is separate from the organic light emitting layer.

2. The apparatus of claim 1, wherein perimeters of the first and second electrodes have substantially the same shape.

3. The apparatus of claim 1, wherein the luminescent material occupies a portion of the overlap region to produce a pattern within the overlap region.

4. The apparatus of claim 1, wherein the luminescent material comprises at least one inorganic phosphor.

5. The apparatus of claim 1, wherein the luminescent material comprises at least one organic dye.

6. The apparatus of claim 1, wherein the luminescent material comprises at least one of $SrB_4O_7:Sm^{2+}$, $Y_3Al_5O_{12}:Ce^{3+}$, $SrGa_2S_4:Eu^{2+}$, and $BaMg2Al_{16}O_{27}:Eu^{2+}$.

7. The apparatus of claim 1, wherein the organic light emitting layer emits ultraviolet light.

8. The apparatus of claim 1, wherein the apparatus has a rectangular perimeter, the perimeter having dimensions of A4 paper or 8.5×11 inch paper.

9. The apparatus of claim 1 further comprising a second luminescent material which emits a second color of light upon absorbing light emitted by the organic light emitting layer.

10. The apparatus of claim 1, wherein the luminescent material comprises a first layer of luminescent material and a second layer of luminescent material disposed on the first layer of luminescent material.

11. An apparatus comprising:
    a plurality of non-overlapping pairs of electrodes, each of the pairs consisting of a first electrode and a second electrode;
    an organic light emitting layer disposed between the first and second electrodes of each of the pairs of electrodes, wherein the first and second electrodes of each of the pairs of electrodes together define an overlap region in which the organic light emitting layer is activated to emit light when a voltage is applied across the pair of electrodes, and an area covered by one pair of electrodes is distinct from an area covered by a different pair of electrodes; and
    a luminescent material which receives light from the organic light emitting layer and converts the light to a different wavelength, wherein the luminescent material is disposed in a portion of the overlap region.

12. The apparatus of claim 1, further comprising an encapsulation layer disposed between the luminescent material and the first electrode.

13. The apparatus of claim 1, further comprising a transparent substrate onto which is applied the luminescent material, wherein the transparent substrate includes an adhesive backing.

14. The apparatus of claim 13, wherein the transparent substrate is adhered to the encapsulation layer with the adhesive backing.

* * * * *